(12) United States Patent
Nagai et al.

(10) Patent No.: US 9,406,668 B2
(45) Date of Patent: Aug. 2, 2016

(54) POWER SEMICONDUCTOR ELEMENT

(71) Applicant: Panasonic Intellectual Property Management Co., Ltd., Osaka (JP)

(72) Inventors: Shuichi Nagai, Osaka (JP); Daisuke Ueda, Osaka (JP); Tatsuo Morita, Tokyo (JP); Tetsuzo Ueda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/779,104

(22) PCT Filed: Feb. 25, 2014

(86) PCT No.: PCT/JP2014/000989
§ 371 (c)(1),
(2) Date: Sep. 22, 2015

(87) PCT Pub. No.: WO2014/155959
PCT Pub. Date: Oct. 2, 2014

(65) Prior Publication Data
US 2016/0056150 A1    Feb. 25, 2016

(30) Foreign Application Priority Data

Mar. 27, 2013  (JP) .................................. 2013-067457

(51) Int. Cl.
*H01L 29/778* (2006.01)
*H01L 27/06* (2006.01)
(Continued)

(52) U.S. Cl.
CPC ........ *H01L 27/0605* (2013.01); *H01L 27/0248* (2013.01); *H01L 27/0629* (2013.01);
(Continued)

(58) Field of Classification Search
CPC . H01L 29/778; H01L 29/7787; H01L 29/205; H01L 27/0248; H01L 27/0727; H01L 27/0605; H01L 27/0629
See application file for complete search history.

(56) References Cited

U.S. PATENT DOCUMENTS 5,500,619 A    3/1996  Miyasaka
7,701,296 B2 *  4/2010  Inoue ..................... H03F 1/523
                                              330/298

(Continued)

FOREIGN PATENT DOCUMENTS

JP          6-53795        2/1994
JP          6-244414       9/1994

(Continued)

OTHER PUBLICATIONS

International Search Report issued May 27, 2014 in International Application No. PCT/JP2014/000989.

(Continued)

*Primary Examiner* — Dale E Page
*Assistant Examiner* — Paul Budd
(74) *Attorney, Agent, or Firm* — Wenderoth, Lind & Ponack, L.L.P.

(57) ABSTRACT

A power semiconductor element includes: a main transistor including a first gate electrode, a first drain electrode, and a first source electrode; a sensor transistor including a second gate electrode, a second drain electrode, and a second source electrode; and a gate switch transistor including a third gate electrode, and a third drain electrode, a third source electrode. The first gate electrode, the second gate electrode, and the third drain electrode are connected, the first drain electrode and the second drain electrode are connected, the first source electrode and the second source electrode are connected via a sensor resistor, the first source electrode and the third source electrode are connected, the second source electrode and the third gate electrode are connected via a switch resistor, and the main transistor, the sensor transistor, and the gate switch transistor are formed with a nitride semiconductor.

14 Claims, 8 Drawing Sheets

(51) Int. Cl.
*H01L 29/20* (2006.01)
*H01L 27/02* (2006.01)
*H03K 17/082* (2006.01)
*H01L 27/07* (2006.01)

(52) U.S. Cl.
CPC ........ *H01L27/0727* (2013.01); *H01L 29/2003* (2013.01); *H01L 29/778* (2013.01); *H03K 17/0822* (2013.01)

(56) References Cited

U.S. PATENT DOCUMENTS

| | | | |
|---|---|---|---|
| 7,755,415 B2* | 7/2010 | Zhang | H03D 7/125 327/427 |
| 8,344,463 B2 | 1/2013 | Yanagihara et al. | |
| 8,569,843 B2 | 10/2013 | Yanagihara et al. | |
| 2006/0249752 A1* | 11/2006 | Asano | H01L 27/0605 257/197 |
| 2010/0213503 A1 | 8/2010 | Yanagihara et al. | |
| 2011/0304360 A1 | 12/2011 | Nakamura et al. | |
| 2013/0087858 A1 | 4/2013 | Yanagihara et al. | |
| 2014/0231875 A1* | 8/2014 | Takatani | H01L 27/0266 257/195 |

FOREIGN PATENT DOCUMENTS

| | | |
|---|---|---|
| JP | 9-18310 | 1/1997 |
| JP | 3710900 | 10/2005 |
| JP | 2006-319213 | 11/2006 |
| JP | 2010-103158 | 5/2010 |
| JP | 2012-4254 | 1/2012 |

OTHER PUBLICATIONS

Masahiro Hikita et al., "350V/150A ALGaN/GaN power HFET on Silicon substrate with source-via grounding (SVG) structure", Electron Devices Meeting, 2004. IEDM Technical Digest. IEEE International, Dec. 13-15, 2004, p. 803-806.

Alice Pie-Shan Hsieh et al., "700V Smart Trench IGBT with monolithic over-voltage and over-current protecting functions", Power Semiconductor Devices and ICs (ISPSD), 2012 24th International Symposium on Jun. 3-7, 2012, p. 61-64.

* cited by examiner

POWER SEMICONDUCTOR ELEMENT

TECHNICAL FIELD

The present invention relates to a power semiconductor element.

BACKGROUND ART

A semiconductor designed for, for example, converting and controlling power such as an inverter system is referred to as a power semiconductor. A power semiconductor for controlling a high voltage and a large current is desired to be capable of using a large power efficiently. For this reason, the power semiconductor needs to maintain a leak current without breaking even when an extremely high voltage is applied. A maximum applicable voltage is referred to as a resisting pressure.

For example, a motor that is used for a household air conditioner outputs a power of 1 kW. For this reason, a power semiconductor for use in an air conditioner needs to be resistant against, for example, a voltage of 100 V or above and a current of 10 A. Furthermore, a power semiconductor switching element needs to minimize power loss on a path in order to control a current path. For this reason, the ON resistance of the power semiconductor switching element needs to be minimum.

There are various kinds of power semiconductor switching elements such as a switching element using an insulation gate bipolar transistor (IGBT) and a switching element using SiC. Among this, a field-effect transistor (FET) using a nitride semiconductor (for example, a nitride gallium (GaN)) has been actively researched and developed as a next-generation element (for example, refer to Non-patent Literature 1).

The power semiconductor switching element such as an FET has a source terminal, a drain terminal, and a gate terminal. A resistance between the drain and source terminals is controlled by a voltage to be applied to the gate terminal. When a gate voltage reaches or exceeds an ON voltage (Vth), the line between the drain and source is switched from OFF (insulated) to ON (short-circuited).

CITATION LIST

Patent Literature

[PTL 1]
  Japanese Patent Publication No. 3710900
[PTL 2]
  Japanese Unexamined Patent Application Publication No. 9-018310

Non Patent Literature

[NPL 1]
  "350V/150A AlGaN/GaN power HFET on silicon substrate with source-via grounding (SVG) structure", Electron Devices Meeting, 2004. IEDM Technical Digest. IEEE International, 13-15 Dec. 2004, pp. 803-806
  Proceedings of the 2012 24th International Symposium on Power Semiconductor Devices and ICs, p61-p64

SUMMARY OF INVENTION

Technical Problem

Such a power semiconductor element using a nitride semiconductor is also desired to be protective against an excess current and an excess voltage.

In view of this, the present invention has an object of providing a power semiconductor element using a nitride semiconductor having an excess current protection function.

Solution to Problem

In order to achieve the above object, the power semiconductor element according to the present invention includes: a main transistor including a first gate electrode, a first drain electrode, and a first source electrode; a sensor transistor including a second gate electrode, a second drain electrode, and a second source electrode; and a gate switch transistor including a third gate electrode, a third drain electrode, and a third source electrode; a sensor resistor; and a switch resistor, wherein the first gate electrode, the second gate electrode, and the third drain electrode are connected, the first drain electrode and the second drain electrode are connected, the first source electrode and the second source electrode are connected via the sensor resistor, the first source electrode and the third source electrode are connected, the second source electrode and the third gate electrode are connected via the switch resistor, and the main transistor, the sensor transistor, and the gate switch transistor are formed with a nitride semiconductor.

These general and specific aspects may be implemented using a system, a method, and an integrated circuit, or any combination of systems, methods, and integrated circuits.

Advantageous Effects of Invention

The present invention provides a power semiconductor element using a nitride semiconductor having an excess current protection function.

DESCRIPTION OF EMBODIMENTS (Underlying Knowledge Forming Basis of the Present Invention)

In relation to the power semiconductor switching element disclosed in the Background section, the inventors have found the following problem.

A power semiconductor switching element is used in an inverter system that drives a motor etc. In the inverter system, a large current may flow between a drain and source in such a manner that a voltage reaching or exceeding a maximum resisting pressure of the power semiconductor switching element is sometimes applied. For this reason, in the inverter system, an excess current protection circuit that detects an excess voltage or an excess current is arranged outside. These additional circuits have a problem of increasing the cost of the system.

Furthermore, recent years have seen increase in performance and speed of power semiconductor switching elements. In this circumstances, because it takes too long time for such a system having a configuration of detecting an excess current and an excess voltage using an external circuit and switching OFF a power semiconductor switching element takes long time to switch it OFF, and it is difficult for the system to be protective against the excess current and the excess voltage appropriately.

With this, a system having a configuration of detecting an excess current and an excess voltage, and integrating an excess current protection circuit that switches OFF a power semiconductor switching element into the power semiconductor switching element has been proposed (for example, see Non-patent Literature 2, Patent Literatures 1 and 2).

Hereinafter, as a reference example, an exemplary IGBT excess current protection circuit and operations performed thereby are described with reference to FIG. 1.

Figure 1:
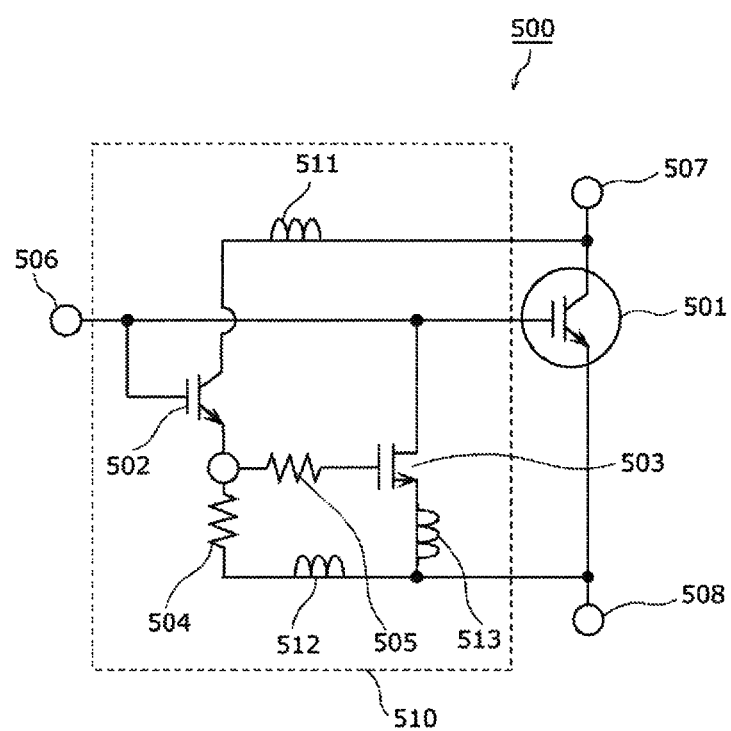
FIG. 1 is a circuit diagram of a power semiconductor element according to a reference example of an embodiment.

The power semiconductor element 500 illustrated in FIG. 1 includes: a main transistor 501 that is a power semiconductor switching element; and an excess current protection circuit 510 which detects an excess current that flows in the main transistor 501 and protects the main transistor 501. The main transistor 501 includes a gate terminal 506, a collector terminal 507, and an emitter terminal 508.

The excess current protection circuit 510 includes: a sensor transistor 502 which detects an excess current flowing in the main transistor 501; a gate switch transistor 503 for switching OFF the gate of the main transistor 501 when the excess current is detected; a sensor resistor 504; and a switch resistor 505.

The collector of the main transistor 501 and the collector of the sensor transistor 502 are connected, and the gate of the main transistor 501 and the gate of the sensor transistor 502 are connected. The emitter of the sensor transistor 502 is connected to the emitter of the main transistor 501 via the sensor resistor 504.

In other words, when the main transistor 501 is switched ON, the sensor transistor 502 is also switched ON. When a large voltage is applied between the collector and the emitter of the main transistor 501 and a large current flows between the collector and the emitter of the main transistor 501, a current also flows in the sensor transistor 502. In addition, the main transistor 501 and the sensor transistor 502 form a current mirror circuit. Thus, a current according to a size ratio between the main transistor 501 and the sensor transistor 502 flows between the main transistor 501 and the sensor transistor 502. At this time, with the presence of the sensor resistor 504, the voltage of the emitter of the sensor transistor 502 is represented by a product of a current flowing in the sensor resistor and a resistance value of the sensor resistor 504. The excess current protection circuit 510 detects an excess current by monitoring the voltage.

The emitter of the sensor transistor 502 is connected to the gate of the gate switch transistor 503. Thus, the gate switch transistor 503 switches ON and OFF according to the emitter voltage of the sensor transistor 502. The drain of the gate switch transistor is connected to the gate of the main transistor 501, and the source of the gate switch transistor 503 is connected to the emitter of the main transistor 501. Thus, when the gate switch transistor is switched ON, the main transistor 501 is switched OFF.

With this configuration, the excess current protection circuit detects an excess current of the main transistor 501, and switches OFF the main transistor 501.

Here, the gate drive voltage of the IGBT is approximately 15 V, and the ON voltage of the gate switch transistor 503 is approximately 3 V. Thus, when an excess current is detected, the voltage between the gate and the emitter of the sensor transistor 502 is 12 V (=15 V-3 V), and the sensor transistor 502 remains in an ON state.

Here, since operating principles of a nitride semiconductor are different from those of an IGBT, when a transistor using a nitride semiconductor is used as a power semiconductor switching element, there is a need to configure an excess current protection circuit suitable for the nitride semiconductor.

Figure 2:
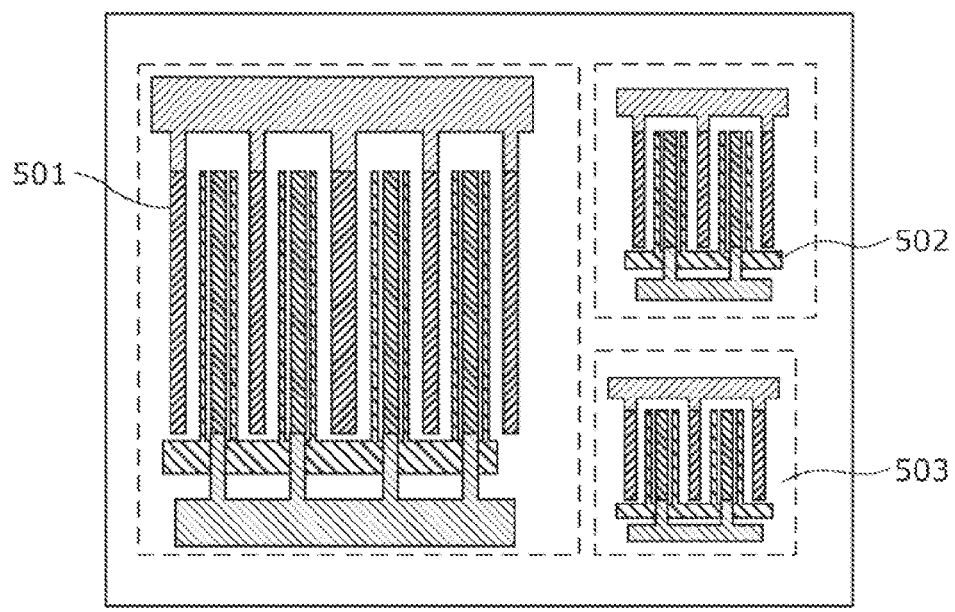
FIG. 2 is a circuit diagram of a power semiconductor element according to a reference example of the embodiment.

In this circuit, as illustrated in FIG. 2 for example, a chip is formed to have separate areas of a main transistor 501, and a sensor transistor 502, a gate switch transistor 503. In other words, the respective transistors are formed as separate units and arranged at intervals.

The Inventors of the present invention found a problem below that arises when an excess current protection circuit and a nitride power switching element are tried to be integrated using the circuit as explained as the above technique with reference to FIG. 1.

When the circuit illustrated in FIG. 1 is configured using the nitride semiconductor transistor, the gate drive voltage of the nitride semiconductor transistor is approximately 3 V. Thus, when the ON voltage of the gate switch transistor 503 is 1.5 V, the gate and source voltage of the sensor transistor 502 is 1.5 V (3 V-1.5 V). Thus, the sensor transistor 502 switches OFF, and no current is detected. In addition, in the circuit illustrated in FIG. 1, an excess current is detected once, and when the gate of the main transistor 501 is switched OFF, the sensor transistor 502 remains in an ON state. Thus, the main transistor 501 remains OFF for a long time, which produces a problem that a return time is long. Here, an excess current occurs only for an extremely short time, and a state where an excess current keeps flowing for a long time rarely occurs. When an excess current flows for a long time, an excess current protection function of an external drive system handles the problem, and thus the power semiconductor element does not need to handle the problem in such a case. Furthermore, when the main transistor 501 switches OFF, a large current flows in the sensor transistor 502. In this way, the inventors found a first problem that the sensor transistor 502 is broken or a large loss occurs in the sensor transistor 502.

In addition, in order to configure the excess current protection circuit as described above, a resistor element needs to be formed. The inventors found a second problem that the formation process increases the cost.

In addition, using the excess current protection circuit as described above, the excess current protection circuit and the power semiconductor switching element need to be integrated in order to control ON and OFF of the power semiconductor switching element at a high speed. Here, as illustrated in FIG. 2, when the respective circuits are formed at intervals, inductor components are added to the respective lines. For example, the inductors 511 to 513 illustrated in FIG. 1 are added to the respective lines. In this way, the inventors found a third problem that no high-speed operation can be performed and noise occurs.

In other words, a resistor element needs to be integrated inside the main transistor 501 or around elements that constitute the main transistor 501.

Here, the resistor element is, for example, fabricated using WSi etc. as materials through a heat dissipation process or the like. However, these materials when becoming impurities deteriorate the characteristics of the main transistor 501. Thus, it is difficult to arrange the resistor element around the gate of the main transistor 501. In addition, in the process of fabricating the resistor element, a contact area, an etch back process, etc. are necessary. Next, a resistor line that functions as this resistor element is easily cut, it is impossible to refine the resistor line. For this reason, it is difficult to fabricate the resistor element around the gate of the main transistor.

In this embodiment, descriptions are given of the power semiconductor element in which the excess current protection circuit is integrated, which has a small temperature dependency, and is capable of performing stable operations at high speed.

The power semiconductor element according to an aspect of the present invention includes: a main transistor including a first gate electrode, a first drain electrode, and a first source electrode; a sensor transistor including a second gate electrode, a second drain electrode, and a second source electrode; and a gate switch transistor including a third gate electrode, a third drain electrode, and a third source electrode; a sensor resistor; and a switch resistor, wherein the first gate electrode, the second gate electrode, and the third drain electrode are connected, the first drain electrode and the second drain electrode are connected, the first source electrode and the second source electrode are connected via the sensor resistor, the first source electrode and the third source electrode are connected, the second source electrode and the third gate electrode are connected via the switch resistor, and the main transistor, the sensor transistor, and the gate switch transistor are formed with a nitride semiconductor.

With this configuration, it is possible to provide a power semiconductor element using a nitride semiconductor having an excess current protection function. In addition, the power semiconductor element is capable of recovering an operation in a short time after the power semiconductor element detects an excess current and performs a circuit protection operation.

For example, the power semiconductor element may further include a capacitor inserted between the third gate electrode and the third source electrode.

With this configuration, the power semiconductor element has an excess current protection function for performing a stable operation at a high speed. Furthermore, it is possible to adjust a period in which the main transistor is OFF during excess current detection by adjusting the capacitance value of the capacitor.

For example, the power semiconductor element may further include a first resistor inserted between (i) the first gate electrode and the third drain electrode and (ii) the second gate electrode.

With this configuration, the power semiconductor element has an excess current protection function for performing a stable operation at a high speed.

For example, the power semiconductor element may further include a second resistor inserted between the first drain electrode and the second drain electrode.

With this configuration, the power semiconductor element has an excess current protection function for performing a stable operation at a high speed.

For example, either an ON voltage of the main transistor or an ON voltage of the gate switch transistor may be lower than or equal to 3 V.

With this configuration, the power semiconductor element has an excess current protection function for performing a stable operation at a high speed.

For example, each of the main transistor, the sensor transistor, and the gate switch transistor may be a gate injection transistor.

For example, the main transistor, the sensor transistor, and the gate switch transistor may include: a GaN layer formed above a substrate; an AlGaN layer formed above the GaN layer; and first, second, and third gate contact layers formed above the AlGaN layer, wherein the first, second, third gate electrodes may be formed above the first, second, and third gate contact layers, respectively, the first source electrode and the first drain electrode may be formed at positions which are above the AlGaN layer and which sandwich the first gate contact layer, the second source electrode and the second drain electrode may be formed at positions which are above the AlGaN layer and which sandwich the second gate contact layer, the third source electrode and the third drain electrode may be formed at positions which are above the AlGaN layer and which sandwich the third gate contact layer, and the sensor resistor and the switch resistor may be formed in a layer identical to the first, second, and third gate contact layers.

It is possible to configure the power semiconductor element having this configuration at low cost. The power semiconductor element has properties that are less affected by temperature.

For example, a material of the gate contact layer may be $p^+$ AlGaN.

It is possible to configure the power semiconductor element having this configuration at low cost.

For example, the main transistor may include a plurality of first sub transistors connected in parallel to each other, either the sensor transistor or the gate switch transistor may include a plurality of second sub transistors connected in parallel to each other, and each of a plurality of first electrodes may be connected to a corresponding one of a plurality of second electrodes via a corresponding one of a plurality of lines which are separate from each other, the plurality of first electrodes being of the plurality of first sub transistors and being a plurality of gate electrodes, a plurality of source electrodes, or a plurality of drain electrodes, and the plurality of second electrodes being of the plurality of second sub transistors and being a plurality of gate electrodes, a plurality of source electrodes, or a plurality of drain electrodes.

With this configuration, the power semiconductor element has an excess current protection function for performing a stable current protection function at a high speed. Furthermore, the power semiconductor element having the excess current protection function can be configured to have small dimensions.

For example, a distance between (i) either the sensor resistor or the switch resistor and (ii) one of the first gate electrode, the first drain electrode, the first source electrode, the second gate electrode, the second drain electrode, the second source electrode, the third gate electrode, the third drain electrode, and the third source electrode may be smaller than or equal to 100 micrometers.

With this configuration, the power semiconductor element has an excess current protection function for performing a stable current protection function at a high speed. Furthermore, the power semiconductor element having the excess current protection function can be configured to have small dimensions. Furthermore, the respective elements of the power semiconductor element are less different in temperature.

For example, the main transistor may include a plurality of first sub transistors connected in parallel to each other, the sensor transistor may include a plurality of second sub transistors connected in parallel to each other, each of the plurality of first sub transistors may include a first drain sub electrode, a first gate sub electrode, and a first source sub electrode which extend in a first direction and are arranged in a second direction orthogonal to the first direction when the power semiconductor element is viewed in a plan view, the plurality of first sub transistors may be arranged in the second direction, each of the plurality of second sub transistors may include a second drain sub electrode, a second gate sub electrode, and a second source sub electrode which extend in the first direction and are arranged in the second direction, the plurality of second sub transistors may be arranged in the second direction, the main transistor and the sensor transistor may be arranged in the first direction, the sensor resistor may include a plurality of first sub transistors, each of the plurality of first sub transistors may be arranged between a first source sub electrode and a second source sub electrode arranged in the first direction, the main transistor and the gate switch transistor may be arranged in the second direction, the third drain electrode, the third gate electrode, and the third source electrode may be arranged in the second direction and each of which extends in the first direction, the switch resistor may have an end that is connected to an end part which is of the second source sub electrode and to which the first sub resistor is not connected, the second source sub electrode being arranged at a side of the gate switch transistor, and the switch resistor has an end that is connected to an end part which is of the third gate electrode and at a side of which the sensor transistor is arranged.

With this configuration, the power semiconductor element has an excess current protection function for performing a stable operation at a high speed.

For example, the main transistor may include a plurality of first sub transistors connected in parallel to each other, the sensor transistor may include a plurality of second sub transistors connected in parallel to each other, each of the plurality of first sub transistors may include a first drain sub electrode, a first gate sub electrode, and a first source sub electrode which extend in a first direction and are arranged in a second direction orthogonal to the first direction when the power semiconductor element is viewed in a plan view, the plurality of first sub transistors may be arranged in the second direction, each of the plurality of second sub transistors may include a second drain sub electrode, a second gate sub electrode, and a second source sub electrode which extend in the first direction and are arranged in the second direction, the plurality of second sub transistors may be arranged in the second direction, the main transistor and the sensor transistor may be arranged in the first direction, the sensor resistor may include a plurality of first sub transistors, the switch resistor may include a plurality of second sub resistors, the gate switch transistor may include a plurality of third sub transistors, and a plurality of units may be arranged in the second direction, each of the units including (i) two of the plurality of first sub transistors, (ii) two of the plurality of second sub transistors arranged in the first direction together with the two of the plurality of first sub transistors, (iii) a corresponding one of the plurality of first sub resistors, a corresponding one of the plurality of second sub resistors, and a corresponding one of the plurality of third sub transistors, the corresponding one of the plurality of first sub resistors, the corresponding one of the plurality of second sub resistors, and the corresponding one of the plurality of third sub transistors being disposed between the two of the plurality of first sub transistors and the two of the plurality of second sub transistors.

With this configuration, the power semiconductor element has an excess current protection function for performing a stable operation at a high speed.

For example, the main transistor may include a plurality of first sub transistors connected in parallel to each other, the sensor transistor may include a plurality of second sub transistors connected in parallel to each other, the gate switch transistor may include a plurality of third sub transistors connected in parallel to each other, each of the plurality of first sub transistors may include a first drain sub electrode, a first gate sub electrode, and a first source sub electrode which extend in a first direction and are arranged in a second direction orthogonal to the first direction when the power semiconductor element is viewed in a plan view, the plurality of first sub transistors may be arranged in the second direction, each of the plurality of second sub transistors may include a second drain sub electrode, a second gate sub electrode, and a second source sub electrode which extend in the first direction and are arranged in the second direction, the plurality of second sub transistors may be arranged in the second direction, each of the plurality of third sub transistors may include a third drain sub electrode, a third gate sub electrode, and a third source sub electrode which extend in the first direction and are arranged in the second direction, the plurality of third sub transistors may be arranged in the second direction, the main transistor and the sensor transistor may be arranged in the second direction, and the main transistor and the gate switch transistor may be arranged in the first direction.

With this configuration, the power semiconductor element has an excess current protection function for performing a stable operation at a high speed.

For example, the main transistor may include a plurality of first sub transistors connected in parallel to each other, the sensor transistor may include a plurality of second sub transistors connected in parallel to each other, the gate transistor may include a plurality of third sub transistors connected in parallel to each other, each of the plurality of first sub transistors may include a first drain sub electrode, a first gate sub electrode, and a first source sub electrode which extend in a first direction and are arranged in a second direction orthogonal to the first direction when the power semiconductor element is viewed in a plan view, the plurality of first sub transistors may be arranged in the second direction, each of the plurality of second sub transistors may include a second drain sub electrode, a second gate sub electrode, and a second source sub electrode which extend in the first direction and are arranged in the second direction, the plurality of second sub transistors may be arranged in the second direction, each of the plurality of third sub transistors may include a third drain sub electrode, a third gate sub electrode, and a third source sub electrode which extend in the first direction and are arranged in the second direction, the plurality of third sub transistors may be arranged in the second direction, and the main transistor, the sensor transistor, and the gate switch transistor may be arranged in the second direction.

With this configuration, the power semiconductor element has an excess current protection function for performing a stable operation at a high speed.

These general and specific aspects may be implemented using a system, a method, and an integrated circuit, or any combination of systems, methods, and integrated circuits.

Hereinafter, this embodiment is described in detail with reference to the drawings.

An embodiment described below shows a specific example of the present invention. The numerical values, shapes, materials, constituent elements, the arrangement position and connection forms of the constituent elements, steps, the processing order of the steps etc. shown in the following exemplary embodiment are mere examples, and therefore do not limit the present invention. Therefore, among the constituent elements in the following exemplary embodiment, constituent elements not recited in any one of the independent claims each of which represents the most generic inventive concept are described as arbitrary constituent elements.

Embodiment 1

In this embodiment, a description is given of a circuit configuration of a power semiconductor element using a nitride semiconductor and including an excess current protection circuit.

Figure 3:
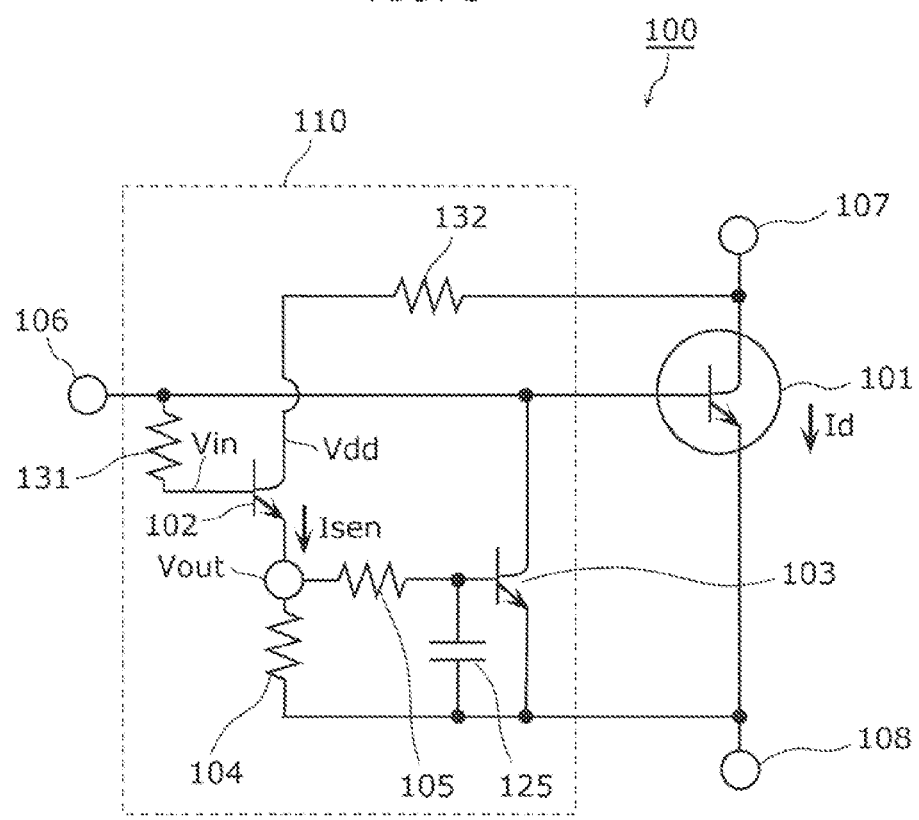
FIG. 3 is a circuit diagram of a power semiconductor element according to Embodiment 1.

FIG. 3 is a circuit diagram of the power semiconductor 100 having the excess current protection circuit. The power semiconductor element 100 illustrated in FIG. 3 includes: a main transistor 101 which is a power semiconductor switching element using the nitride semiconductor; and the excess current protection circuit 110.

The excess current protection circuit 110 detects an excess current flowing in the main transistor 101, and protects the main transistor 101. The excess current protection circuit 110 includes: a sensor transistor 102; a gate switch transistor 103; a sensor resistor 104; a first sensor resistor 131; a second sensor resistor 132; a switch resistor 105; a holding capacitor 125; a gate terminal 106; a drain terminal 107; and a source terminal 108.

Hereinafter, the gate, drain, and source of the main transistor are also referred to as a first gate electrode, a first drain electrode, and a first source electrode, respectively. The gate, drain, and source of the sensor transistor 102 are also referred to as a second gate electrode, a second drain electrode, and a second source electrode, respectively. The gate, drain, and source of the gate switch transistor 103 are also referred to as a third gate electrode, a third drain electrode, and a third source electrode, respectively.

The gate terminal 106 is connected to the first gate electrode of the main transistor 101. The drain terminal 107 is connected to the first drain electrode of the main transistor 101. The source terminal 108 is connected to the first source electrode of the main transistor 101.

The first gate electrode of the main transistor 101 is connected to the second gate electrode of the sensor transistor 102 via the first sensor resistor 131. The first drain electrode of the main transistor is connected to the second drain electrode of the sensor transistor 102 via the second sensor resistor 132. The first source electrode of the main transistor 101 is connected to the second source electrode of the sensor transistor 102 via the sensor resistor 104.

The holding capacitor 125 (capacitor) is inserted between the third gate electrode and the third source electrode of the gate switch transistor 103. The first sensor resistor 131 (first resistor) is inserted between (i) the first gate electrode 116 and the third drain electrode 157 and (ii) the second gate electrode 146. The second sensor resistor 132 (second resistor) is inserted between the first drain electrode 117 and the second drain electrode 147.

The third drain electrode of the gate switch transistor 103 is connected to the first gate electrode of the main transistor 101. The third source electrode of the gate switch transistor 103 is connected to the first source electrode of the main transistor 101. The third gate electrode of the gate switch transistor 103 is connected to the second source electrode of the sensor transistor 102 via the switch resistor 105.

Here, the main transistor 101, the sensor transistor 102, and the gate switch transistor 103 are formed with a nitride semiconductor. Specifically, these transistors are gate injection nitride semiconductor transistors. It is to be noted that the configurations of the gate injection nitride semiconductor transistors are described later.

In other words, the operating principles of the main transistor 101, the sensor transistor 102, and the gate switch transistor 103 are different from those of the main transistor 501, the sensor transistor 502, and the gate switch transistor 503 (IGBT). Thus, the circuit illustrated in FIG. 3 is different in operating principles from the circuit illustrated in FIG. 1.

Figure 4:
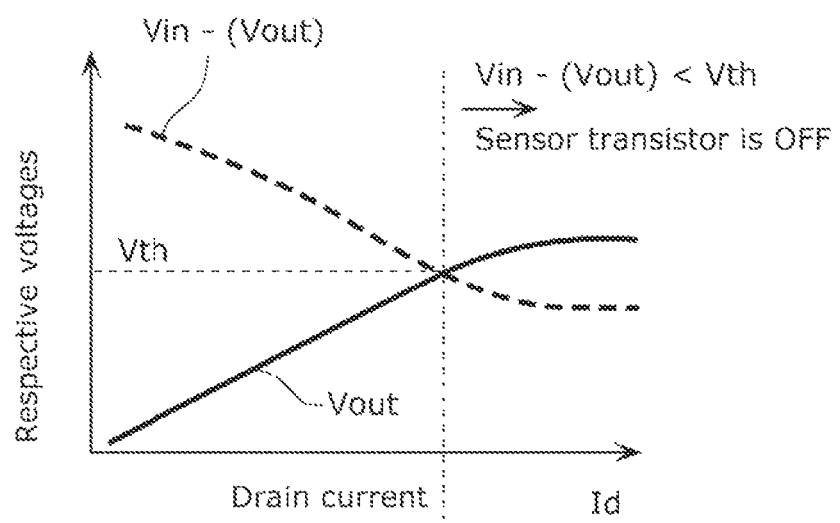
FIG. 4 is a diagram indicating a power semiconductor element according to Embodiment 1.

FIG. 4 is a graph showing a source voltage (Vout) of the sensor transistor 102 to the drain current (Id) of the main transistor 101 and a voltage between the source and gate (Vin-Vout) of the sensor transistor 102.

Here, the sensor transistor 102 operates as a source follower. Thus, the source voltage (Vout) of the sensor transistor 102 increases in proportion to the drain current (Id). In this way, the excess current protection circuit 110 detects the drain current (Id) of the main transistor 101 using the source voltage (Vout).

However, as the current flowing in either the drain current or the sensor resistor 104 increases, the source voltage of the sensor transistor 102 increase, and the voltage between the source and the gate of the sensor transistor 102 decreases. When the voltage between the source and the gate of the sensor transistor 102 decrease below an ON voltage (Vth) of the sensor transistor 102, the sensor transistor 102 switches OFF. In this way, the excess current protection circuit 110 is capable of reducing a drain current of the sensor transistor 102 when the drain current of the main transistor reaches or exceeds a certain value, that is, when an excess current flows in the main transistor 101. In this way, the excess current protection circuit 110 has properties different from those of the excess current protection circuit 510 illustrated in FIG. 1.

In addition, when an excess current is detected once in the excess current protection circuit 110, the gate switch transistor 103 switches ON and the sensor transistor 102 switches OFF at the same time, and thus a recovery time is extremely short. In addition, immediately after the main transistor 101 switches OFF, the sensor transistor 102 switches OFF, and no large current flows in the sensor transistor 102.

In addition, in the excess current protection circuit 110, by adjusting the sizes etc. of the switch resistor 105, the holding capacitor 125, and the gate switch transistor 103, it is possible to adjust a period in which the gate switch transistor 103 is ON during excess current detection, that is, time from when the gate switch transistor 103 switches ON to when it switches OFF.

It is to be noted that a line resistor may be used as the switch resistor 105. In other words, the switch resistor 105 does not always need to be an exclusive resistor element.

The configuration of the excess current protection circuit 110 illustrated in FIG. 3 is an example, and thus, it is also possible to use a current mirror configuration. Alternatively, it is possible to use an excess current detection circuit, a gate switch circuit, or another excess current detection circuit, either of which has a configuration other than the configuration in FIG. 3.

In addition, the power semiconductor element 100 does not always need to include all or some of the first sensor resistor 131, the second sensor resistor 132, and the holding capacitor 125.

Embodiment 2

In this embodiment, descriptions are given of a layout (plan view) and a cross sectional configuration of the power semiconductor element 100 described in Embodiment 1.

Figure 5:
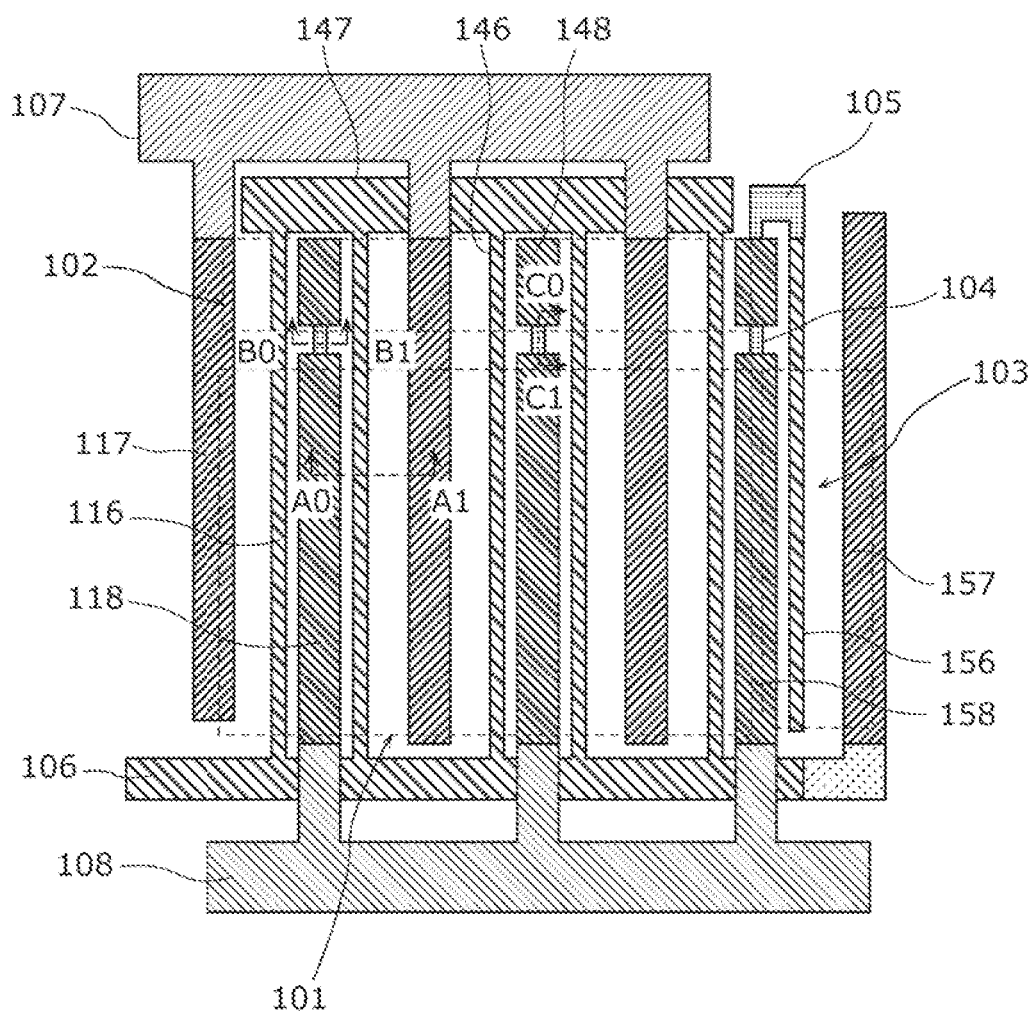
FIG. 5 is a plan view of a power semiconductor element according to Embodiment 2.

FIG. 5 is a plan schematic view of the power semiconductor element 100 according to this embodiment. The power semiconductor element 100 according to this embodiment includes: a main transistor 101 having a gate terminal 106, a drain terminal 107, and a source terminal 108; a sensor transistor 102 for detecting an excess current; a gate switch transistor 103 for switching OFF the main transistor 101 while an excess current is being applied; a sensor resistor 104; and a switch resistor 105.

The main transistor 101 includes: a first gate electrode 116; a first drain electrode 117; and a first source electrode 118. The sensor transistor 102 includes: a second gate electrode 146; a second drain electrode 147; and a second source electrode 148. The gate switch transistor 103 includes: a third gate electrode 156; a third drain electrode 157; and a third source electrode 158. The gate terminal 106, the drain terminal 107, the source terminal 108 are connected to the first gate electrode 116 of the main transistor 101, the first drain electrode 117, and the first source electrode 118.

It is to be noted that the connection relationships between the electrodes are the same as in FIG. 3. Hereinafter, for simplification, descriptions are given of a case where the power semiconductor element 100 does not include the first sensor resistor 131, the second sensor resistor 132, and the holding capacitor 125.

The main transistor 101 includes: a rectangular first source electrode 118; a rectangular first drain electrode 117; and a rectangular first gate electrode 116 arranged between the first source electrode 118 and the first drain electrode 117. These electrodes extend along a first direction (the vertical direction in this page space). In other words, the first direction is the longitudinal direction of each electrode. Hereinafter, the direction (horizontal direction of the page space) orthogonal to the first direction is referred to as a second direction. Here, the first direction and the second direction are directions when the power semiconductor element 100 is seen in plan view.

At one (the upper direction in FIG. 3) of the sides in the first direction of the main transistor 101, a sensor transistor 102 is formed. In other words, the main transistor 101 and the sensor transistor 102 are arranged in the first direction (in the vertical direction).

The sensor transistor 102 includes: a rectangular second source electrode 148; a rectangular second drain electrode 147; and a rectangular second gate electrode 146 arranged between the second source electrode 148 and the second drain electrode 147. In addition, the orientation of these electrodes is the same as the orientation of the electrodes of the main transistor 101. In other words, the longitudinal direction of these electrodes is the first direction.

A sensor resistor 104 is formed between the first drain electrode 117 of the main transistor 101 and the second source electrode 148 of the sensor transistor 102.

Here, the main transistor 101 is configured with a plurality of first sub transistors connected in parallel to each other. Each of the plurality of the first sub transistors includes the first gate electrode (first gate sub electrode), the first drain electrode 117 (first drain sub electrode), and the first source electrode 118 (first source sub electrode). In addition, the plurality of first sub transistors are arranged in the second direction (horizontal direction). In addition, the plurality of first sub transistors are inverted horizontally in an alternate arrangement order. One of the first sub transistors shares one of the first drain electrodes 117 with one of neighboring first sub transistors, and shares one of the first source electrodes 118 with the other one of the neighboring first sub transistors.

Likewise, the sensor transistor 102 is configured with a plurality of second sub transistors connected in parallel to each other. In addition, the arrangement of these second sub transistors is the same as the arrangement of a plurality of sub transistors that constitute the main transistor 101. In other words, each of the second sub transistors includes the second gate electrode 146 (second gate sub electrode), the second drain electrode 147 (second drain sub electrode), and the second source electrode 148 (second source sub electrode). The plurality of second sub transistors are arranged in the second direction (horizontal direction). In addition, the plurality of second sub transistors are inverted horizontally in an alternate arrangement order. One of the second sub transistors shares one of the second drain electrodes 147 with one of neighboring second sub transistors, and shares one of the second source electrode 148 with the other one of the second sub transistors.

In addition, the sensor resistor 104 is configured with a plurality of first sub resistors. Each of the first sub resistors is arranged between a corresponding one of the first drain electrodes and a corresponding one of the second source electrode 148 which are arranged in the first direction.

In addition, a plurality of units each constitutes the following are formed: a corresponding one of the first sub transistors, a corresponding one of the second sub transistors which is arranged above the corresponding one of the first sub resistors, and a corresponding one of the first sub resistors which is arranged between the first and second sub transistors. These plurality of units are arranged in the second direction (horizontal direction). In addition, the plurality of units are inverted horizontally in an alternate arrangement order. One of the units shares one of the first drain electrodes 117 and one of the second drain electrodes 147 with one of neighboring units, and shares one of the first source electrodes 118, one of the second source electrodes 148, and one of the first sub resistors (sensor resistor 104) with the other one of the neighboring units.

In addition, in the plurality of units, the plurality of first gate electrodes 116 are connected to each other, the plurality of first drain electrodes 117 are connected to each other, and the plurality of first source electrodes 118 are connected to each other.

In addition, in the plurality of units, the plurality of second gate electrodes 146 are connected to each other, and the plurality of second drain electrodes 147 are connected to each other.

In addition, the first gate electrode 116 and the second gate electrode 146 included in an identical one of the units are connected to each other. The first drain electrode 117 and the second drain electrode 147 included in an identical one of the units are connected to each other. The first source electrode 118 and the second source electrode 148 included in an identical one of the units are connected to each other via the first sub resistor (sensor resistor 104) included in the identical unit.

The gate switch transistor 103 is formed in one side (right direction) of the second direction of the main transistor 101. In other words, the main transistor 101 and the gate transistor 103 are arranged in the second direction (horizontal direction).

The gate switch transistor 103 includes: a rectangular third source electrode 158; a rectangular third drain electrode 157; and a rectangular third gate electrode 156 arranged between the third source electrode 158 and the third drain electrode 157. In addition, the orientation of these electrodes is the same as the orientation of the electrodes of the main transistor 101. In other words, the longitudinal direction of these electrodes is the first direction. In other words, the third drain electrode 157, the third gate electrode 156, and the third source electrode 158 are arranged in the second direction, and extend in the first direction.

In addition, the third source electrode 158 is shared with the first source electrode 118 of the first sub transistor (first sub transistor at the right end) of the main transistor 101 neighboring to the gate switch transistor 103.

The switch resistor 105 is arranged (i) above the sensor transistor 102, (ii) at the side at which the gate switch transistor 103 is arranged, and (iii) above the gate switch transistor 103. One of the ends of the switch resistor 105 is connected to the end part (upper end part) to which the sensor resistor 104 of the second source electrode 148 of the sensor transistor 102 is not connected among the end parts of the second source electrode 148. The other end of the switch resistor 105 is connected to the one (upper end) of the ends of the third gate electrode 156 of the gate switch transistor 103. In other words, the one end of the switch resistor 105 is connected to the end part to which the first sub resistor of the second source electrode 148 arranged at one of the end parts of the gate switch transistor 103 is not connected. The other end of the switch resistor 105 is connected to the end part at the side at which the sensor transistor 102 of the third gate electrode 156 is arranged.

The third drain electrode 157 of the gate switch transistor 103 and the first gate electrode 116 of the main transistor 101 are connected.

The use of the arrangement illustrated in FIG. 5 makes it possible to form the excess current protection circuit 110 including the sensor transistor 102, the gate switch transistor 103, the sensor resistor 104, and the switch resistor 105, in each of minimum units that constitute the power semiconductor element 100.

Here, either "integration inside a main transistor" or "integration inside a minimum unit" means that each transistor is formed with a plurality of sub transistors, and individual sub transistors of different transistors are connected to each other via a plurality of lines. In other words, in the example illustrated in FIG. 2, each of the gate, drain, and source terminals of the main transistor and one of the terminals of the sensor transistor 502 and the gate switch transistor 503 are electrically connected via a single line. On the other hand, in this embodiment, among a plurality of sets each having a corresponding one of the terminals of the main transistor 101 and another corresponding one of the transistors which is electrically connected to the corresponding one of the terminals, two terminals included in at least part of the plurality of sets are connected via a plurality of lines. In other words, a line for connecting corresponding terminals is provided for each of the sub transistors (or units).

In other words, the main transistor 101 includes the plurality of first sub transistors connected in parallel to each other. Either the sensor transistor 102 or the gate switch transistor 103 includes the plurality of second sub transistors connected in parallel to each other. Each of a plurality of first electrodes is connected to a corresponding one of a plurality of second electrodes via a corresponding one of a plurality of lines which are separate from each other. The plurality of first electrodes being of the plurality of first sub transistors and being a plurality of gate electrodes, a plurality of source electrodes, or a plurality of drain electrodes, and the plurality of second electrodes being of the plurality of second sub transistors and being a plurality of gate electrodes, a plurality of source electrodes, or a plurality of drain electrodes.

More specifically, the plurality of first gate electrodes 116 of the main transistor 101 and the plurality of second gate electrodes of the sensor transistor 102 are connected via a plurality of lines. In other words, for each of sets of the first gate electrodes 116 and the second gate electrodes 146, a line is provided between the first gate electrode 116 and the second gate electrode 146 and the line connects the first gate electrode 116 and the second gate electrode 146. Likewise, the plurality of first drain electrodes 117 of the main transistor 101 and the plurality of second drain electrodes 147 of the sensor transistor 102 are connected via a plurality of lines. In addition, the plurality of first source electrodes 118 of the main transistor 101 and the plurality of second source electrodes 148 of the sensor transistor 102 are connected via a plurality of lines and the plurality of first sub resistors (sensor resistors 104).

In addition, at least one of the sensor resistor 104 and the switch resistor 105 is arranged close to either the gate electrode, the drain electrode, or the source electrode of either the main transistor 101, the sensor transistor 102, or the gate switch transistor 103. For example, the distance between at least one of the sensor resistor and the switch resistor 105 and either the gate electrode, the drain electrode, or the source electrode is smaller than or equal to micrometer.

As described above, the respective transistors are closely arranged in the power semiconductor element according to this embodiment, and thus it is possible to reduce delay between the lines. In addition, the power semiconductor element is capable of reducing parasitic inductor and parasitic capacitor, and thus is capable of functioning the excess current protection function at a high speed. Furthermore, since the respective transistors are close, the properties thereof can be less affected by noise, and temperature. In addition, since the lines which connect the respective circuits are short, it is possible to arrange the respective elements efficiently. In this way, it is possible to configure the power semiconductor element at low cost.

Hereinafter, descriptions are given of a cross sectional configuration of the power semiconductor element according to this embodiment.

Figure 6A:
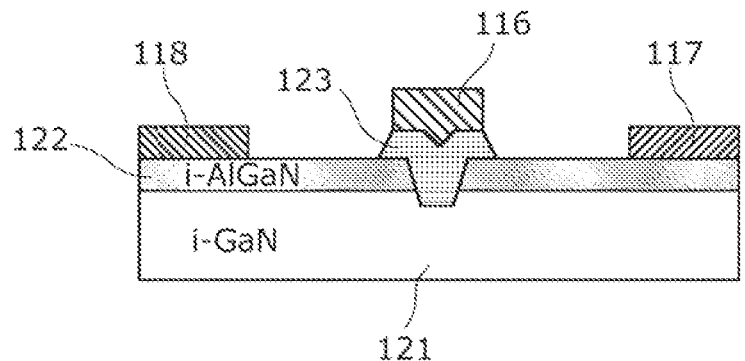
FIG. 6A is a sectional schematic view of a power semiconductor element according to Embodiment 2.
Figure 6B:
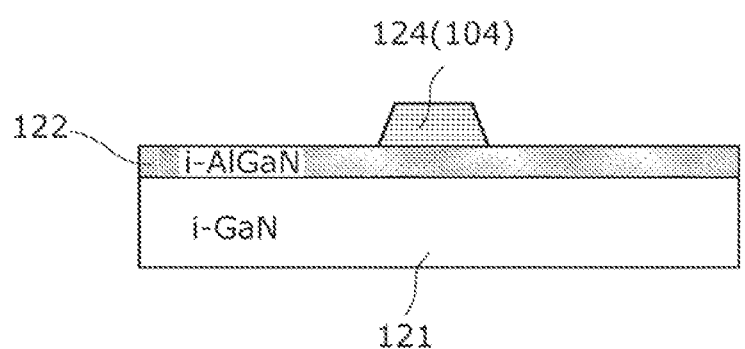
FIG. 6B is a sectional schematic view of the power semiconductor element according to Embodiment 2.
Figure 6C:
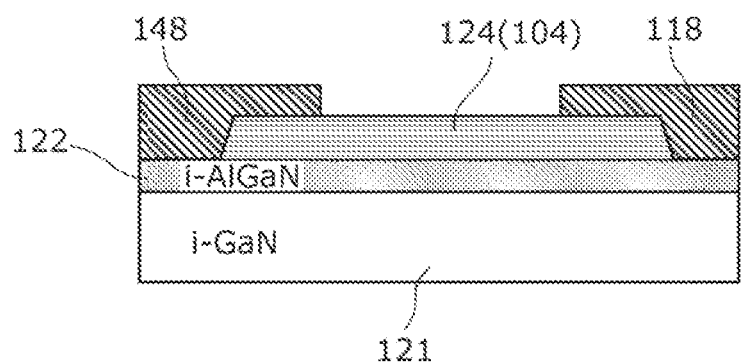
FIG. 6C is a sectional schematic view of the power semiconductor element according to Embodiment 2.

FIG. 6A is a cross sectional schematic view of the power semiconductor switching element (the main transistor 101, the sensor transistor 102, and the gate switch transistor 103) according to this embodiment. In addition, each of FIGS. 6B and 6C is a cross sectional schematic view of the resistor element (sensor resistor 104 and switch resistor 105). For example, FIG. 6A corresponds to a cross section along A0 to A1 illustrated in FIG. 5, FIG. 6B corresponds to a cross section along B0 to B1 illustrated in FIG. 5, and FIG. 6C corresponds to a cross section along C0 to C1 illustrated in FIG. 5.

The power semiconductor element according to this embodiment includes: a GaN substrate (not illustrated); a buffer layer (not illustrated) formed above the GaN substrate; a GaN epitaxial layer 121 (GaN layer) formed above the buffer layer; and an AlGaN layer 122 formed above the GaN epitaxial layer 121.

In an area in which the transistors of the power semiconductor element are formed, as illustrated in FIG. 6A, the first source electrode 118 and the first drain electrode 117 made of a gold or cupper material, or the like are formed above the AlGaN layer 122. A gate contact layer 123 made of p$^+$ AlGaN (p-type AlGaN) is formed at a position between the first drain electrode 117 and the first source electrode 118 and above the GaN epitaxial layer 121. The first gate electrode 116 made of a metal material is formed above the gate contact layer 123.

In other words, the first, second, and third gate contact layers included in the main transistor 101, the sensor transistor 102, and the gate switch transistor 103 are respectively formed above the AlGaN layer 122. The first gate electrode 116, the second gate electrode 146, and the third gate electrode 156 are respectively formed above the first, second, and third gate contact layer 123. The first source electrode 118 and the first drain electrode 117 are formed at positions which are above the AlGaN layer 122 and which sandwich the first gate contact layer 123. The second source electrode 148 and the second drain electrode 147 are formed (i) at positions above the AlGaN layer 122 and (ii) to sandwich the second gate contact layer 123. The third source electrode 158 and the third drain electrode 157 are formed (i) at positions above the AlGaN layer and (ii) to sandwich the third gate contact layer 123.

In addition, as illustrated in FIGS. 6B and 6C, the sensor resistor 104 and the switch resistor 105 are formed using the p$^+$ AlGaN resistor layer 124 formed above the AlGaN layer 122.

As known by comparing FIG. 6A with FIGS. 6B and 6C, in the power semiconductor element according to this embodiment, the same p$^+$ AlGaN used for the gate contact layer 123 and the resistor layer 124 of the transistor is used. In other words, the sensor resistor 104 and the switch resistor 105 are formed in the layer identical to the first, second, and third gate contact layers 123. In other words, the gate contact layer 123 and the resistor layer 124 are formed using the same material, and are formed in the same process.

In this way, an unnecessary process for forming resistor elements is eliminated. For this reason, it is possible to fabricate a power semiconductor element in which an excess current protection circuit is integrated.

In addition, p$^+$ AlGaN is used as a material of the resistor elements. This material as an impurity less affects the properties of the main transistor 101. For this reason, it is possible to arrange the resistor elements around the main transistor 101.

Furthermore, it is possible to fabricate resistor elements having a fine pattern because it is possible to fabricate the resistor elements in the same process for fabricating the gate contact layer 123. Furthermore, contact to an upper layer required for metal resistors is unnecessary because a p$^+$ AlGaN epitaxial layer is used in the resistor layer 124. In this way, it is possible to arrange the resistor elements around the main transistor 101. In addition, since no contact is necessary, it is unnecessary to prevent disconnection of lines due to unevenness of the contact part or secure a wide area to be used to prevent disconnection.

Furthermore, a process for etch back etc. required for metal resistors is unnecessary, and thus it is possible to form a fine resistor pattern in a small area.

In addition, the area surrounding the gate of the main transistor 101 has an extremely high temperature. Thus, the resistance values of metal resistors change, and it is impossible to arrange the metal resistors around the gate of the main transistor 101. In addition, the epitaxial layer resistor of a silicon semiconductor also has a temperature dependency. On the other hand, the epitaxial layer resistor of the nitride semiconductor has a wide band gap and thus the temperature thereof is low. Thus, the epitaxial layer resistor of the nitride semiconductor is arranged close to the gate.

The use of the configuration makes it possible to realize the pattern arrangement illustrated in FIG. 5.

It is to be noted that, in FIG. 6A, the distance between the first gate electrode 116 and the first source electrode 118 approximately equals to the distance between the first gate electrode 116 and the first drain electrode 117, but the former distance and the latter distance may not be equal.

In addition, the intervals between the gate electrodes and the drain electrodes may vary among the main transistor 101, the sensor transistor 102, and the gate switch transistor 103. Likewise, the intervals between the gate electrodes and the source electrodes may vary among the main transistor 101, the sensor transistor 102, and the gate switch transistor 103.

Although an example of using the resistor layer 124 for the sensor resistor 104 and the switch resistor 105 is described here, the first sensor resistor 131 and the second sensor resistor 132 may be generated using the same method.

In each of FIGS. 6B and 6C, the resistor layer 124 is formed above the AlGaN layer 122. However, the resistor layer 124 may be formed above the GaN epitaxial layer 121 (may penetrate through the AlGaN layer 122) in the same manner as the gate contact layer 123.

In FIG. 6A, the gate contact layer 123 is formed above the GaN epitaxial layer 121 (penetrates through the AlGaN layer 122), but may be formed above the AlGaN layer 122 in the same manner as the resistor layer 124.

In addition, the resistor material may be a material other than p$^+$ AlGaN. In addition, the p$^+$ AlGaN of the gate contact layer 123 and the p$^+$ AlGaN of the resistor layer 124 may vary in the concentration of the impurities or the thicknesses of the layers. Furthermore, a resistor layer made of another material may be formed above the resistor layer 124.

In the above description, an AlGaN layer 122 is formed above the GaN epitaxial layer 121, a layer made of a material having another composition may be formed therebetween or above the AlGaN layer 122.

Hereinafter, a variation example of the arrangement of transistors is described.

Figure 7:
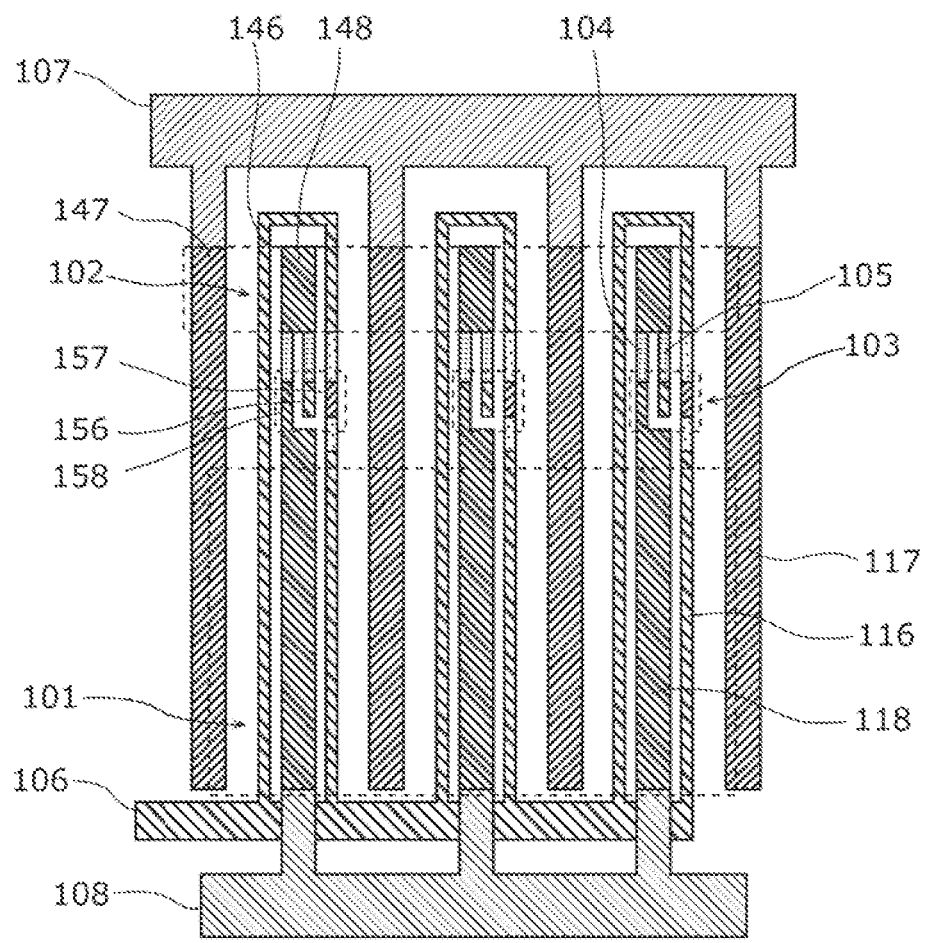
FIG. 7 is a plan view of a power semiconductor element according to Variation 1 of Embodiment 2.

FIG. 7 is a plan schematic view of a power semiconductor element according to Variation 1 of Embodiment 1.

The arrangement example illustrated in FIG. 7 is different mainly in the positions of a gate switch transistor 103 and a switch transistor 105 from the arrangement example illustrated in FIG. 5. Specifically, the gate switch transistor 103 and the switch transistor are formed between a main transistor 101 and a sensor transistor 102 formed in a first direction.

The arrangement and configuration of a main transistor 101 are the same as in FIG. 5. In other words, as in FIG. 5, the main transistor 101 is configured with a plurality of first sub transistors connected in parallel to each other.

The sensor transistor 102 is formed in a first direction (upper side) of the main transistor 101. In other words, the main transistor and the sensor transistor 102 are arranged in the first direction. It is to be noted that the arrangement and configuration of the sensor transistor 102 are the same. In other words, as in FIG. 5, the sensor transistor 102 is configured with a plurality of second sub transistors connected in parallel to each other.

A sensor resistor 104 is formed between the first drain electrode 117 of the main transistor 101 and the second source electrode 148 of the sensor transistor 102. The sensor resistor 104 is configured with a plurality of first sub resistors. Each of the sub resistors is arranged between a corresponding one of the first drain electrodes 117 and a corresponding one of the second source electrodes 148 which are arranged in the first direction.

The gate switch transistor 103 is formed between the main transistor 101 and the sensor transistor 102 arranged next to each other in the first direction. The gate switch transistor 103 includes a plurality of third sub transistors. Each of the third sub transistors is formed between a corresponding one of the first sub transistors and a corresponding one of the second sub transistors arranged next to each other in the first direction.

Each of the third sub transistors includes a third gate electrode 156, a third drain electrode 157, and a third source electrode 158. In addition, the plurality of third sub transistors are arranged in the second direction (horizontal direction).

In addition, a plurality of units each constitutes the following are formed: two of the first sub transistors; two of the second sub transistors which are arranged above the first sub transistors; and a corresponding one of the first sub resistors, the second sub resistors, and the third sub resistors, all of which are arranged between the first sub transistors and the second sub transistors. These plurality of (three in FIG. 7) units are arranged in the second direction (horizontal direction). Every neighboring two of the units share the first drain electrode 117 and the second drain electrode 147.

In addition, in the plurality of units, the plurality of first gate electrodes 116 are connected to each other, the plurality of first drain electrodes 117 are connected to each other, and the plurality of first source electrodes 118 are connected to each other.

In addition, in the plurality of units, the plurality of second gate electrodes 146 are connected to each other, and the plurality of second drain electrodes 147 are connected to each other.

In addition, in an identical one of the units, the two first gate electrodes 116, the two second gate electrodes 146, and the third drain electrodes 157 are connected. The two first drain electrodes and the two second drain electrodes 147 included in an identical one of the units are connected to each other.

The first source electrode 118 and the second source electrode included in the identical unit are connected to each other via the first sub resistor (sensor resistor 104) included in the identical unit. The first source electrode 118 and the third source electrode 158 included in the identical unit are connected to each other. The second source electrode 148 and the third gate electrode 156 included in the identical unit are connected via the second sub resistors (switch resistor 105).

In addition, among a plurality of sets of the terminals of the main transistor 101 and the corresponding terminals of another one of the transistors, two terminals included in at least part of the sets are connected via a plurality of lines. In other words, a line for connecting corresponding terminals is provided for each of the sub transistors (or units).

More specifically, the plurality of first gate electrode 116, the plurality of second gate electrode 146, and the plurality of third drain electrode 157 are connected via a plurality of lines. The plurality of first drain electrodes 117 and the plurality of second drain electrodes are connected via a plurality of lines. The plurality of first source electrodes 118 and the plurality of third source electrodes 158 are connected via a plurality of lines. The plurality of first source electrodes 118, the plurality of third source electrodes 158, and the plurality of second source electrodes 148 are connected via a plurality of lines and the plurality of first sub resistors (sensor resistor 104). The plurality of second source electrodes 148 and the plurality of third gate electrodes 156 are connected via the plurality of lines and the plurality of second sub resistors (switch resistor 105).

With this configuration, excess current protection circuits can be integrated for each of the units of the excess current protection circuits inside the power switching element.

Figure 8:
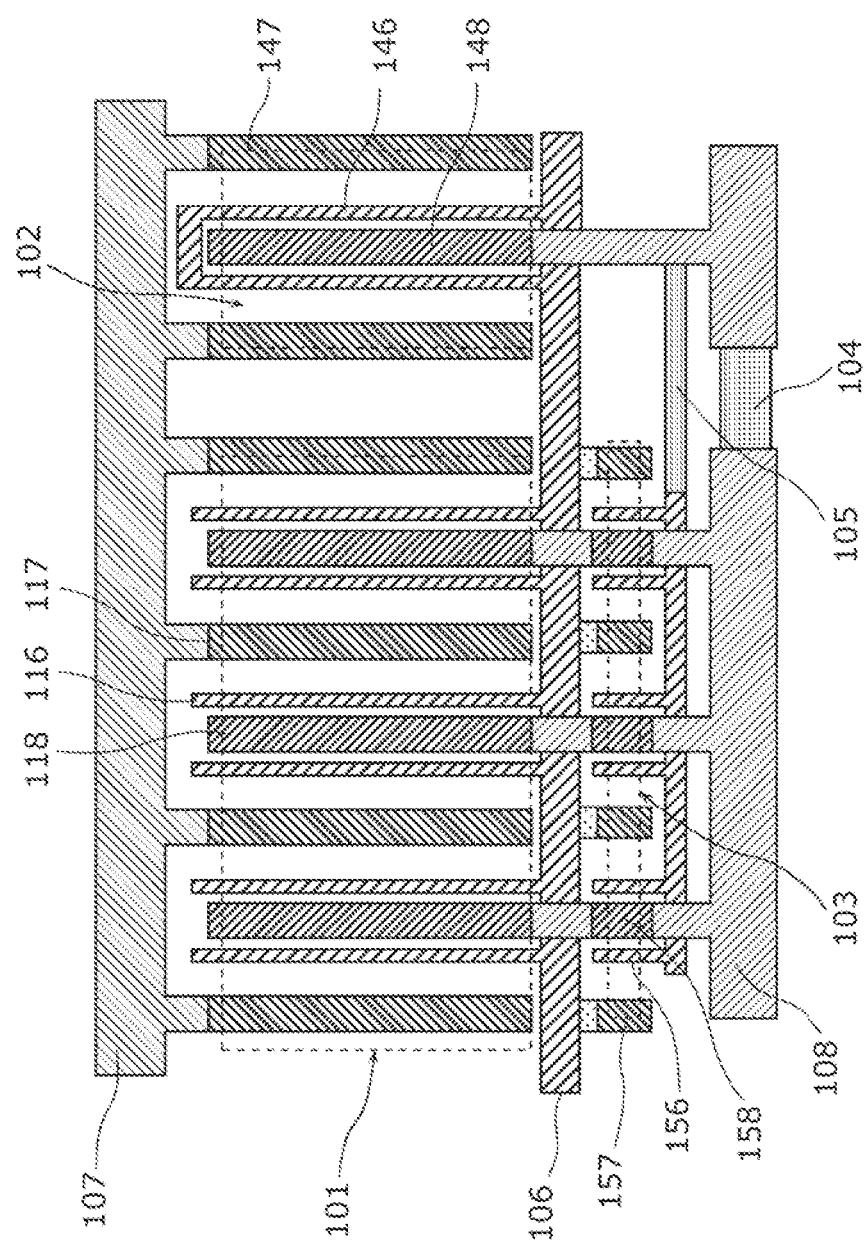
FIG. 8 is a plan view of a power semiconductor element according to Variation 2 of Embodiment 2.

Hereinafter, an arrangement example according to Variation 2 of this embodiment is described. FIG. 8 is a plan schematic view of the power semiconductor element according to Variation 2 of this embodiment.

In the arrangement example illustrated in FIG. 8, a main transistor 101 and a gate switch transistor 103 are arranged in a first direction (horizontal direction). In addition, a sensor transistor 102 is arranged in a second direction (horizontal direction) with a main transistor 101.

The arrangement and configuration of the main transistor 101 are the same as in FIG. 5. In other words, as in FIG. 5, the main transistor 101 is configured with a plurality of first sub transistors connected in parallel to each other.

The sensor transistor 102 is formed in the second direction (right side) of the main transistor 101. It is to be noted that the sensor transistor 102 has the same arrangement and configuration as in FIG. 5. In other words, as in FIG. 5, the sensor transistor 102 is configured with a plurality of second sub transistors connected in parallel to each other.

The gate switch transistor 103 is formed in the first direction (lower side) of the main transistor 101. The gate switch transistor includes a plurality of third sub transistors connected in parallel to each other. Each of the third sub transistors extends in the first direction, and includes a third drain electrode 157 (third drain sub electrode), a third gate electrode 156 (third gate sub electrode), and a third source electrode 158 (third source sub electrode) arranged in the second direction.

A sensor resistor 104 has an end connected to a second source electrode 148, and the other end connected to a first source electrode 118 and a third source electrode 158.

A switch resistor 105 has an end connected to a second source electrode 148, and the other end connected to a third gate electrode 156.

In addition, among a plurality of sets of the terminals of the main transistor 101 and the corresponding terminals of another one of the transistors, two terminals included in at least part of the sets are connected via a plurality of lines. In other words, a line for connecting corresponding terminals is provided for each of the sub transistors (or units).

More specifically, the plurality of first source electrodes 118 and the plurality of third source electrode 158 are connected via a plurality of lines.

With this configuration, it is possible to obtain properties and effects equivalent to those obtained in the arrangement examples illustrated in FIGS. 5 and 7.

Figure 9:
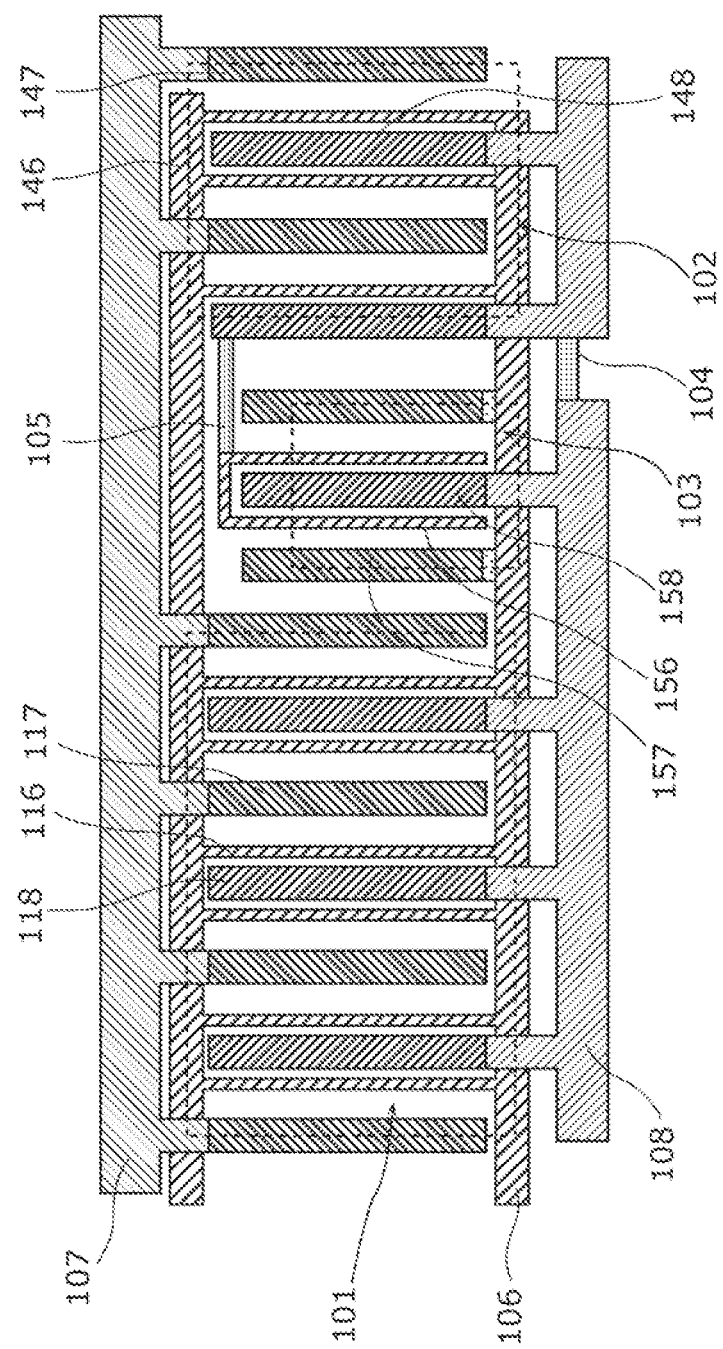
FIG. 9 is a plan view of a power semiconductor element according to Variation 3 of Embodiment 2.

Hereinafter, an arrangement example according to Variation 3 of this embodiment is described. FIG. 9 is a plan schematic view of the power semiconductor element according to Variation 3 of this embodiment.

In the arrangement example illustrated in FIG. 9, a main transistor 101, a gate switch transistor 103, and a sensor transistor are arranged in a second direction (horizontal direction) in this order.

It is to be noted that the arrangement and configuration of the main transistor 101 are the same as in FIG. 8. In other words, as in FIG. 8, the main transistor 101 is configured with a plurality of first sub transistors connected in parallel to each other.

The main transistor 101 is formed in the second direction (right side) of the gate switch transistor 103. It is to be noted that the arrangement and configuration of the gate switch transistor 103 are the same as in FIG. 8. In other words, as in FIG. 8, the gate switch transistor 103 includes a plurality of third sub transistors.

The sensor transistor 102 is formed in the second direction (right side) of the gate switch transistor 103. It is to be noted that the arrangement and configuration of the sensor transistor 102 are the same as in FIG. 8. In other words, as in FIG. 8, the sensor transistor 102 is configured with a plurality of second sub transistors connected in parallel to each other.

A sensor resistor 104 has an end connected to a second source electrode 148, and the other end connected to a first source electrode 118 and a third source electrode 158.

A switch resistor 105 has an end connected to a second source electrode 148, and the other end connected to a third gate electrode 156.

With this configuration, it is possible to obtain properties and effects equivalent to those obtained in the arrangement examples illustrated in FIGS. 5, 7, and 8.

As described above, the power semiconductor element according to the embodiment of the present invention has been described, but the present invention is not limited to the embodiment.

For example, although an example of an FET made of nitride gallium is used as a power semiconductor switching element, it is also possible to use a device made of another material or having another configuration. The excess current protection circuit 110 according to Embodiment 1 is effective as an excess current protection circuit using a device having a low operation gate voltage and a low ON voltage. For example, the excess current protection circuit 110 is effective as an excess current protection circuit using the power semiconductor switching element whose ON voltage (a threshold voltage) is 3 V or below. In addition, the excess current protection circuit 110 is effective as an excess current protection circuit using a device having a small difference between an operation gate voltage and an ON voltage.

Although an example of forming resistor elements included in the excess current protection circuit 110 using the gate contact layer have been described above, this technique is applicable to all of circuits for which a power semiconductor switching element can be used.

In other words, the power semiconductor element according to an aspect of the embodiment includes a power semiconductor switching element made of a nitride semiconductor and a resistor element.

The power semiconductor element includes: a GaN epitaxial layer 121 formed above a substrate; an AlGaN layer 122 formed above the GaN epitaxial layer 121; a gate contact layer 123 formed above the AlGaN layer 122; a gate electrode (for example, a first gate electrode 116) formed above the gate contact layer 123; a drain electrode and a source electrode (for example, the first drain electrode 117 and the first source electrode 118) which are formed (i) at positions above the AlGaN layer 122 and (ii) to sandwich the gate contact layer 123. The resistor element is formed using the gate contact layer 123. In other words, the resistor element is formed using the gate contact layer 123.

In addition, the power semiconductor element according to this embodiment is implemented as an LSI which is typically a single-chip integrated circuit.

In addition, the plan views and cross sectional views are schematic views. For example, although the corner parts and sides of the respective constituent elements are described linearly in these diagrams, the present invention includes a configuration including elements having rounded corner parts and sides.

The circuit configurations illustrated in the circuit diagrams are examples, and thus embodiments are not limited to the circuit configurations. In other words, the present invention covers any circuits which can provide unique functions of the embodiment, in addition to the above-described circuit configurations. For example, the present invention covers any configuration in which a switching element (transistor), a resistor element, a capacitor element, or the like are connected to a certain element in series or in parallel in the range which can provide the same functions as in the above-described circuit configurations. In other words, "connected" in this embodiment is not limited to a case where two terminals (nodes) are connected directly (without any other intervening element), and includes a case where the two terminals (nodes) are connected via an element in a range in which similar functions can be provided.

In addition, all of the numerals used above are examples for specifically explaining the embodiment, and thus the embodiment is not limited to the exemplary numerals. In addition, all of the materials of the respective constituent elements above are examples for specifically explaining the embodiment, and thus the embodiment is not limited to the exemplary materials. In addition, the connection relationships between the constituent elements above are examples for specifically explaining the embodiment, and thus connection relationships for achieving the functions of the embodiment are not limited to the exemplary connection relationships.

The power semiconductor element according to one or plural aspects have been described above based on the embodiment, the present invention is not limited to the embodiment. The one or plural aspects include, in the scope, various kinds of modifications conceivable and may be made to the embodiment by a person skilled in the art, and embodiments obtainable by combining some of constituent elements in different embodiments.

INDUSTRIAL APPLICABILITY

The present invention is applicable to a power semiconductor element, and is effective as a high power electric component.

| [Reference Signs List] | |
|---|---|
| 100, 500 | Power semiconductor element |
| 101, 501 | Main transistor |
| 102, 502 | Sensor transistor |
| 103, 503 | Gate switch transistor |
| 104, 504 | Sensor resistor |
| 105, 505 | Switch resistor |
| 106, 506 | Gate terminal |
| 107 | Drain terminal |
| 108 | Source terminal |
| 110, 510 | Excess current protection circuit |
| 116 | First gate electrode |
| 117 | First drain electrode |
| 118 | First source electrode |
| 121 | GaN epitaxial layer |
| 122 | AlGaN layer |
| 123 | Gate contact layer |
| 124 | Resistor layer |
| 125 | Holding capacitor |
| 131 | First sensor resistor |
| 132 | Second sensor resistor |
| 146 | Second gate electrode |
| 147 | Second drain electrode |
| 148 | Second source electrode |
| 156 | Third gate electrode |
| 157 | Third drain electrode |
| 158 | Third source electrode |
| 507 | Collector terminal |
| 508 | Emitter terminal |
| 511, 512, 513 | Inductor |

The invention claimed is:
1. A power semiconductor element comprising:
a main transistor including a first gate electrode, a first drain electrode, and a first source electrode;
a sensor transistor including a second gate electrode, a second drain electrode, and a second source electrode; and
a gate switch transistor including a third gate electrode, a third drain electrode, and a third source electrode;

a sensor resistor; and a switch resistor, wherein the first gate electrode, the second gate electrode, and the third drain electrode are connected, the first drain electrode and the second drain electrode are connected, the first source electrode and the second source electrode are connected via the sensor resistor, the first source electrode and the third source electrode are connected, the second source electrode and the third gate electrode are connected via the switch resistor, and the main transistor, the sensor transistor, and the gate switch transistor are formed with a nitride semiconductor.

2. The power semiconductor element according to claim 1, further comprising a capacitor inserted between the third gate electrode and the third source electrode.

3. The power semiconductor element according to claim 1, further comprising a first resistor inserted between (i) the first gate electrode and the third drain electrode and (ii) the second gate electrode.

4. The power semiconductor element according to claim 1, further comprising a second resistor inserted between the first drain electrode and the second drain electrode.

5. The power semiconductor element according to claim 1, wherein either an ON voltage of the main transistor or an ON voltage of the gate switch transistor is lower than or equal to 3 V.

6. The power semiconductor element according to claim 1, wherein each of the main transistor, the sensor transistor, and the gate switch transistor is a gate injection transistor.

7. The power semiconductor element according to claim 6, wherein the main transistor, the sensor transistor, and the gate switch transistor includes:

a GaN layer formed above a substrate;

an AlGaN layer formed above the GaN layer; and first, second, and third gate contact layers formed above the AlGaN layer, wherein the first, second, third gate electrodes are formed above the first, second, and third gate contact layers, respectively, the first source electrode and the first drain electrode are formed at positions which are above the AlGaN layer and which sandwich the first gate contact layer, the second source electrode and the second drain electrode are formed at positions which are above the AlGaN layer and which sandwich the second gate contact layer, the third source electrode and the third drain electrode are formed at positions which are above the AlGaN layer and which sandwich the third gate contact layer, and the sensor resistor and the switch resistor are formed in a layer identical to the first, second, and third gate contact layers.

8. The power semiconductor element according to claim 7, wherein a material of the gate contact layer is p$^+$ AlGaN.

9. The power semiconductor element according to claim 1, wherein the main transistor includes a plurality of first sub transistors connected in parallel to each other, either the sensor transistor or the gate switch transistor includes a plurality of second sub transistors connected in parallel to each other, and each of a plurality of first electrodes is connected to a corresponding one of a plurality of second electrodes via a corresponding one of a plurality of lines which are separate from each other, the plurality of first electrodes being of the plurality of first sub transistors and being a plurality of gate electrodes, a plurality of source electrodes, or a plurality of drain electrodes, and the plurality of second electrodes being of the plurality of second sub transistors and being a plurality of gate electrodes, a plurality of source electrodes, or a plurality of drain electrodes.

10. The power semiconductor element according to claim 9, wherein a distance between (i) either the sensor resistor or the switch resistor and (ii) one of the first gate electrode, the first drain electrode, the first source electrode, the second gate electrode, the second drain electrode, the second source electrode, the third gate electrode, the third drain electrode, and the third source electrode is smaller than or equal to 100 micrometers.

11. The power semiconductor element according to claim 1, wherein the main transistor includes a plurality of first sub transistors connected in parallel to each other, the sensor transistor includes a plurality of second sub transistors connected in parallel to each other, each of the plurality of first sub transistors includes a first drain sub electrode, a first gate sub electrode, and a first source sub electrode which extend in a first direction and are arranged in a second direction orthogonal to the first direction when the power semiconductor element is viewed in a plan view, the plurality of first sub transistors are arranged in the second direction, each of the plurality of second sub transistors includes a second drain sub electrode, a second gate sub electrode, and a second source sub electrode which extend in the first direction and are arranged in the second direction, the plurality of second sub transistors are arranged in the second direction, the main transistor and the sensor transistor are arranged in the first direction, the sensor resistor includes a plurality of first sub transistors, each of the plurality of first sub transistors is arranged between a first source sub electrode and a second source sub electrode arranged in the first direction, the main transistor and the gate switch transistor are arranged in the second direction, the third drain electrode, the third gate electrode, and the third source electrode are arranged in the second direction and each of which extends in the first direction, the switch resistor has an end that is connected to an end part which is of the second source sub electrode and to which the first sub resistor is not connected, the second source sub electrode being arranged at a side of the gate switch transistor, and the switch resistor has an end that is connected to an end part which is of the third gate electrode and at a side of which the sensor transistor is arranged.

12. The power semiconductor element according to claim 1, wherein the main transistor includes a plurality of first sub transistors connected in parallel to each other, the sensor transistor includes a plurality of second sub transistors connected in parallel to each other, each of the plurality of first sub transistors includes a first drain sub electrode, a first gate sub electrode, and a first source sub electrode which extend in a first direction and are arranged in a second direction orthogonal to the first direction when the power semiconductor element is viewed in a plan view, the plurality of first sub transistors are arranged in the second direction, each of the plurality of second sub transistors includes a second drain sub electrode, a second gate sub electrode, and a second source sub electrode which extend in the first direction and are arranged in the second direction, the plurality of second sub transistors are arranged in the second direction, the main transistor and the sensor transistor are arranged in the first direction, the sensor resistor includes a plurality of first sub transistors, the switch resistor includes a plurality of second sub resistors, the gate switch transistor includes a plurality of third sub transistors, and a plurality of units are arranged in the second direction, each of the units including (i) two of the plurality of first sub transistors, (ii) two of the plurality of second sub transistors arranged in the first direction together with the two of the plurality of first sub transistors, (iii) a corresponding one of the plurality of first sub resistors, a corresponding one of the plurality of second sub resistors, and a corresponding one of the plurality of third sub transistors, the corresponding one of the plurality of first sub resistors, the corresponding one of the plurality of second sub resistors, and the corresponding one of the plurality of third sub transistors being disposed between the two of the plurality of first sub transistors and the two of the plurality of second sub transistors.

13. The power semiconductor element according to claim 1, wherein the main transistor includes a plurality of first sub transistors connected in parallel to each other, the sensor transistor includes a plurality of second sub transistors connected in parallel to each other, the gate switch transistor includes a plurality of third sub transistors connected in parallel to each other, each of the plurality of first sub transistors includes a first drain sub electrode, a first gate sub electrode, and a first source sub electrode which extend in a first direction and are arranged in a second direction orthogonal to the first direction when the power semiconductor element is viewed in a plan view, the plurality of first sub transistors are arranged in the second direction, each of the plurality of second sub transistors includes a second drain sub electrode, a second gate sub electrode, and a second source sub electrode which extend in the first direction and are arranged in the second direction, the plurality of second sub transistors are arranged in the second direction, each of the plurality of third sub transistors includes a third drain sub electrode, a third gate sub electrode, and a third source sub electrode which extend in the first direction and are arranged in the second direction, the plurality of third sub transistors are arranged in the second direction, the main transistor and the sensor transistor are arranged in the second direction, and the main transistor and the gate switch transistor are arranged in the first direction.

14. The power semiconductor element according to claim 1, wherein the main transistor includes a plurality of first sub transistors connected in parallel to each other, the sensor transistor includes a plurality of second sub transistors connected in parallel to each other, the gate transistor includes a plurality of third sub transistors connected in parallel to each other, each of the plurality of first sub transistors includes a first drain sub electrode, a first gate sub electrode, and a first source sub electrode which extend in a first direction and are arranged in a second direction orthogonal to the first direction when the power semiconductor element is viewed in a plan view, the plurality of first sub transistors are arranged in the second direction, each of the plurality of second sub transistors includes a second drain sub electrode, a second gate sub electrode, and a second source sub electrode which extend in the first direction and are arranged in the second direction, the plurality of second sub transistors are arranged in the second direction, each of the plurality of third sub transistors includes a third drain sub electrode, a third gate sub electrode, and a third source sub electrode which extend in the first direction and are arranged in the second direction, the plurality of third sub transistors are arranged in the second direction, and the main transistor, the sensor transistor, and the gate switch transistor are arranged in the second direction.

* * * * *